US009734033B2

(12) United States Patent
Hendrickson et al.

(10) Patent No.: US 9,734,033 B2
(45) Date of Patent: Aug. 15, 2017

(54) IMPLEMENTING PROCESSOR FUNCTIONAL VERIFICATION BY GENERATING AND RUNNING CONSTRAINED RANDOM IRRITATOR TESTS FOR MULTIPLE PROCESSOR SYSTEM AND PROCESSOR CORE WITH MULTIPLE THREADS

(71) Applicant: International Business Machines Corporation, Armonk, NY (US)

(72) Inventors: Olaf K. Hendrickson, Rochester, MN (US); Yugi Morimoto, Poughkeepsie, NY (US); Michael P. Mullen, Poughkeepsie, NY (US); Michal Rimon, Nofit (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/562,908

(22) Filed: Dec. 8, 2014

(65) Prior Publication Data
US 2016/0162380 A1 Jun. 9, 2016

(51) Int. Cl.
*G01R 31/3181* (2006.01)
*G06F 11/22* (2006.01)
*G06F 11/26* (2006.01)
*G06F 11/263* (2006.01)

(52) U.S. Cl.
CPC ...... *G06F 11/263* (2013.01); *G01R 31/31813* (2013.01); *G06F 11/2242* (2013.01); *G06F 11/2236* (2013.01); *G06F 11/261* (2013.01)

(58) Field of Classification Search
CPC ............ G01R 31/31813; G06F 11/261; G06F 11/263; G06F 11/2236; G06F 11/2242
USPC ......................................................... 714/739
See application file for complete search history.

(56) References Cited

U.S. PATENT DOCUMENTS

| 5,729,554 | A | * | 3/1998 | Weir ..................... G06F 11/261 |
| | | | | 714/31 |
| 5,968,194 | A | * | 10/1999 | Wu ................. G01R 31/318544 |
| | | | | 714/726 |
| 6,006,028 | A | | 12/1999 | Aharon et al. |

(Continued)

FOREIGN PATENT DOCUMENTS

| EP | 0747816 A2 | 12/1996 |
| WO | 9921083 A1 | 4/1999 |
| WO | 2013011743 A1 | 1/2013 |

OTHER PUBLICATIONS ip.com, "Multithreaded Programming Model for Hardware Testing Applications," IPCOM000173245D, Jul. 28, 2008.

(Continued)

*Primary Examiner* — James C Kerveros
(74) *Attorney, Agent, or Firm* — Joan Pennington (57) ABSTRACT

A method and system are provided for implementing functional verification including generating and running constrained random irritator tests for a multiple processor system and for a processor core with multiple threads. Separate tests are generated, a main test for one thread, and an irritator test for each other thread in the configuration. The main test and each irritator test are saved and randomly mixed then combined together again, where the main thread is not forced to be generated with any particular irritator.

11 Claims, 10 Drawing Sheets

(56) References Cited

U.S. PATENT DOCUMENTS

| | | | | |
|---|---|---|---|---|
| 6,662,327 | B1* | 12/2003 | Rajski | G01R 31/31813 714/738 |
| 6,748,556 | B1 | 6/2004 | Storino et al. | |
| 6,757,845 | B2* | 6/2004 | Bruce | G11C 29/022 365/201 |
| 6,886,125 | B2* | 4/2005 | Mangelsdorf | G06F 11/263 703/22 |
| 7,096,397 | B2* | 8/2006 | Kundu | G11C 29/40 365/201 |
| 7,178,078 | B2* | 2/2007 | Hiraide | G06F 11/27 714/30 |
| 7,281,185 | B2* | 10/2007 | Maoz | G01R 31/31835 714/738 |
| 7,299,394 | B2* | 11/2007 | Ichino | G06F 11/261 714/738 |
| 7,353,440 | B2* | 4/2008 | Ohwada | G01R 31/318547 714/726 |
| 7,386,778 | B2* | 6/2008 | Udell | G01R 31/318314 714/738 |
| 7,840,865 | B2* | 11/2010 | Lai | G01R 31/318547 714/728 |
| 8,286,042 | B2* | 10/2012 | Gangasani | G01R 31/318385 714/30 |
| 8,479,173 | B2* | 7/2013 | Hickerson | G06F 11/3632 717/135 |
| 2004/0268182 | A1 | 12/2004 | Liu et al. | |
| 2005/0086565 | A1* | 4/2005 | Thompson | G06F 17/5022 714/741 |
| 2008/0082968 | A1* | 4/2008 | Chang | G06F 11/3688 717/128 |
| 2010/0011345 | A1 | 1/2010 | Hickerson et al. | |
| 2013/0205118 | A1 | 8/2013 | Buyuktosunoglu et al. | |
| 2014/0257739 | A1 | 9/2014 | Dagan et al. | |
| 2015/0221396 | A1* | 8/2015 | Subramaniam | G06F 11/2635 714/720 |

OTHER PUBLICATIONS

Appendix P—List of IBM Patents or Patent Applications Treated as Related Sep. 19, 2015.

* cited by examiner

IMPLEMENTING PROCESSOR FUNCTIONAL VERIFICATION BY GENERATING AND RUNNING CONSTRAINED RANDOM IRRITATOR TESTS FOR MULTIPLE PROCESSOR SYSTEM AND PROCESSOR CORE WITH MULTIPLE THREADS

FIELD OF THE INVENTION

The present invention relates generally to the data processing field, and more particularly, relates to a method and apparatus for implementing functional verification including generating and running constrained random irritator tests for a multiple processor system and for a processor core with multiple threads.

DESCRIPTION OF THE RELATED ART

Functional verification techniques are needed for a multiple processor system and for a processor core with multiple threads. There are many examples of computer processor design which make use of simultaneous multiple thread designs. Processors designed with simultaneous multiple threading (SMT) or systems with multiple processors present similar requirements and challenges for pre-silicon functional verification. Some of the challenges are related to verifying the functionality of several aspects of the design that relate to multithreading, such as WO 9921083A1 to Borkenhagen et al., published Apr. 29, 1999, and entitled "Thread Switch Control in a Multithreaded Processor System"; EP747816A2 to Eickenmeyer et al, published Dec. 11, 1996, and entitled "Method and System for High Performance Multithread Operation in a Data Processing System"; or US patent publication US 20130205118 to Buyuktosunoglu et al, published Aug. 8, 2013 and entitled "Multi-Threaded Processor Instruction Balancing Through Instruction Uncertainty". Other challenges are related to verification efficiency, which is described by US patent publication US 2010/0011345 A1 to Hickerson et al., published Jan. 14, 2010, and entitled "Efficient and Self-Balancing Verification of Multi-Threaded Microprocessors"; and U.S. Pat. No. 8,479,173 B2 to Hickerson et al., Jul. 2, 2013, and entitled "Efficient and Self-Balancing Verification of Multi-Threaded Microprocessors".

Microprocessor Pre-Silicon functional verification is typically accomplished by supplying test templates into an automated test case generation tool which produces assembly level instruction sequences. These templates are typically produced by engineers to exercise certain Architectural and Micro Architectural functions within the microprocessor. Such test case generation tools are some times referred to as constrained random test generators. An example constrained random test generator is described by U.S. Pat. No. 6,006,028, to Aharon et al, Dec. 21, 19999, and entitled "Test Program Generator".

Figure 3:
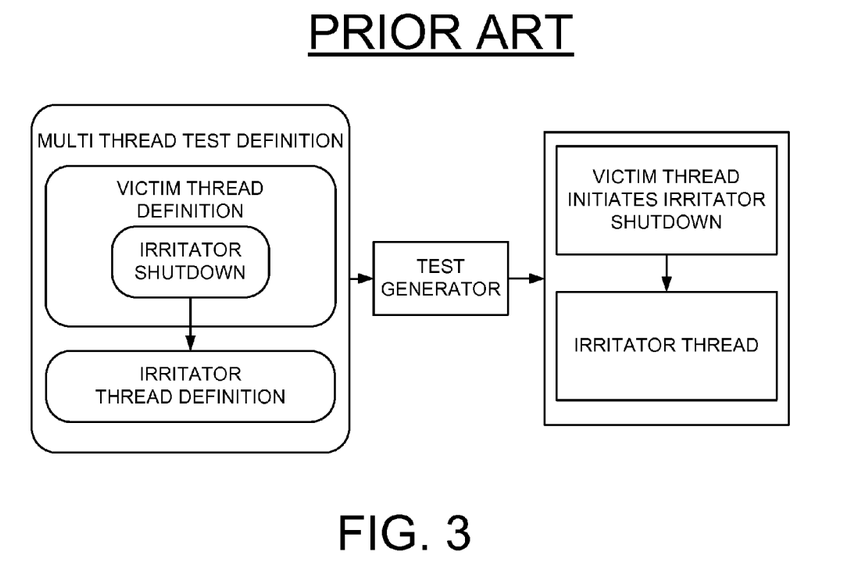
FIG. 3 illustrates a prior art victim thread and irritator thread interaction at a test definition level.

A method of creating test cases described by the above identified U.S. Pat. No. 8,479,173 in the context of constrained random test generation for a symmetric multi-threaded processor (or multi-processor system) is commonly referred to as an Irritator", which refers to a short segment of code that runs as an infinite loop in simulation on one or more threads in a simulation environment while there is at least one thread in the same simulation that is not an irritator, which is referred to as a main thread. This is done for a variety of reasons, including simplifying the test generation process for processor cores with high degrees of multi-threading. Another reason is to provide what looks like a long and very fast executing stream of instructions while only using the test generation resources necessary to generate a very short test. FIG. 3 illustrates the prior art victim thread and irritator threads that are custom definitions, for example, as described by the above identified U.S. Pat. No. 8,479,173.

The very long stream of instructions in an irritator thread is obtained by generating a code loop and then altering the test to make the code loop infinite. This loop is the salient feature of an irritator and is characterized by a finite generation sequence and an indeterminate number of executions in simulation. Several common problems exist in the current art of generating tests that contain irritator threads. In an environment where register and storage values change with each iteration of the loop (a given when generating random instructions), it is necessary to restrict the random nature of operations as the loop iterates indefinitely. Several of these problems are addressed for example, by US patent application publication US 2014/0257739 A1 to Dagan et al., published Sep. 11, 2014, entitled "Implementing Random Context of Program Loops in Random Test Generation for Processor Verification" and assigned to the present assignee. There is an important difference between a fully generated loop and a loop that is partially generated and then runs for an indeterminate number of iterations or partial iterations. The earlier art for generating irritators is to avoid instructions which would cause problems. Several new developments allow more random instructions.

Random conditional branch instructions which could change the branch direction. A fully generated loop with random branches can experience a change in direction of the branch and provide a predicted code path and expected results for the new path. The change in direction is predicted, as explained in the above identified US 2014/0257739 A1, such a change in direction may be undesirable from the point of view of the test objective in terms of early exit from the loop, however, the test remains valid in terms of all expected results in the test are valid. A problem (1a) is that an irritator branch that remains in one direction for the entire loop generation but changes direction in simulation after all generation results have been exhausted may end up with no predicted code path and no expected results. For an irritator, this situation is a catastrophic failure and the test is architecturally invalid. Another problem (1b) is that the test environment has many checkers that verify that any memory location accessed by the hardware during simulation was predicted to be used by the test. Random test generation of a loop contains many hazards, such as using a register in a memory storage address calculation, then later preforming an operation that alters that register, then executing the loop sequence again so that the next storage address is different from the first. As an irritator loop will iterate an indefinite number of times, it is impossible to predict all possible values of future storage locations based on a finite number of loop iterations in the original test generation. Also, no instruction in an irritator thread is guaranteed to complete in simulation so the final result of any predicted store may never have changed in simulation. The simulation environment is not able to distinguish between end of test memory results due to a store from one thread or another and it has a hard time dealing with a situation where a store may or may not occur. In our environment a main thread can race ahead of an irritator thread and finish, which triggers a shut down of the irritator thread before reaching a particular store, so that it is possible that any particular store predicted in the irritator test does not occur in simulation.

The indefinite number of loop iterations poses a problem (1c) for expecting exceptions. In a fully generated loop any data or storage addressing exception that occurs with subsequent iterations of the loop are fully predicted and exception handlers are added to the test during generation. An irritator execution could experience a data exception or storage addressing exception that is not predicted, leaving an unpredicted code path.

Another problem (1d) is that many instructions are not currently solvable and must be avoided.

A second problem (2) results from the embodiment described by the above identified U.S. Pat. No. 8,479,173 states that when the main thread completes, it initiates action to shut down the irritator threads. This is done through instructions generated in both the main and irritator threads, requiring system synchronization between them at test generation time. That requires that each main thread and irritator be generated together at the same time as part of the same test.

A need exists for an effective method and apparatus for implementing functional verification including generating and running constrained random irritator tests for a multiple processor system and for a processor core with multiple threads.

SUMMARY OF THE INVENTION

Principal aspects of the present invention are to provide a method and apparatus for implementing functional verification including generating and running constrained random irritator tests for a multiple processor system and for a processor core with multiple threads. Other important aspects of the present invention are to provide such method, and apparatus substantially without negative effects and that overcome many of the disadvantages of prior art arrangements.

In brief, a method and system are provided for implementing functional verification including generating and running constrained random irritator tests for a multiple processor system and for a processor core with multiple threads. Separate tests are generated, a main test for one thread, and an irritator test for each other thread in the configuration. The main test and each irritator test are saved and randomly mixed then combined together again, where the main thread is not forced to be generated with any particular irritator.

In accordance with features of the invention, the main test and each irritator test are allowed to be completely independent. The main tests can be generated as single thread tests, run in a simulation environment, saved, and later stitched to an irritator test and reused, significantly reducing the processing power required to generate tests for simulation and also reduces effort of writing tests.

In accordance with features of the invention, an enhanced test definition with local testing knowledge allows most standard test definitions to be generated in either a main or irritator context without modification of the test definition. This eliminates the need to write separate test definitions for different contexts. The definitions can be written for a single thread and allow other processes to manipulate them into multi threaded tests. Test definitions can be stitched together before generation (definition stitching), providing a new method used for irritators, but can also be used for general purpose combining of different and unrelated test definitions into new tests that allow the test generator to create shared address interaction between threads that is not possible with simple test stitching.

In accordance with features of the invention, any instruction that can get an exception due to iterative execution in a loop can be tolerated by addition to the test of an unexpected exception handler that returns control of the irritator program stream to a known location and a known state, such as to top or bottom of the irritator loop.

In accordance with features of the invention, most store instructions where the storage address (or addresses) are randomly selected (random stores) are allowed and managed by masking the memory location in the final test file so that the simulation environment ignores the data value at that location while checking results.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing functional verification including generating and running constrained random irritator tests for a multiple processor system and for a processor core with multiple threads in accordance with preferred embodiments. Separate tests are generated, a main test for one thread, and an irritator test for each other thread in the configuration, these tests are saved and randomly mixed then combined together again, so that the main thread is not forced to be generated with any particular irritator.

Figure 1:
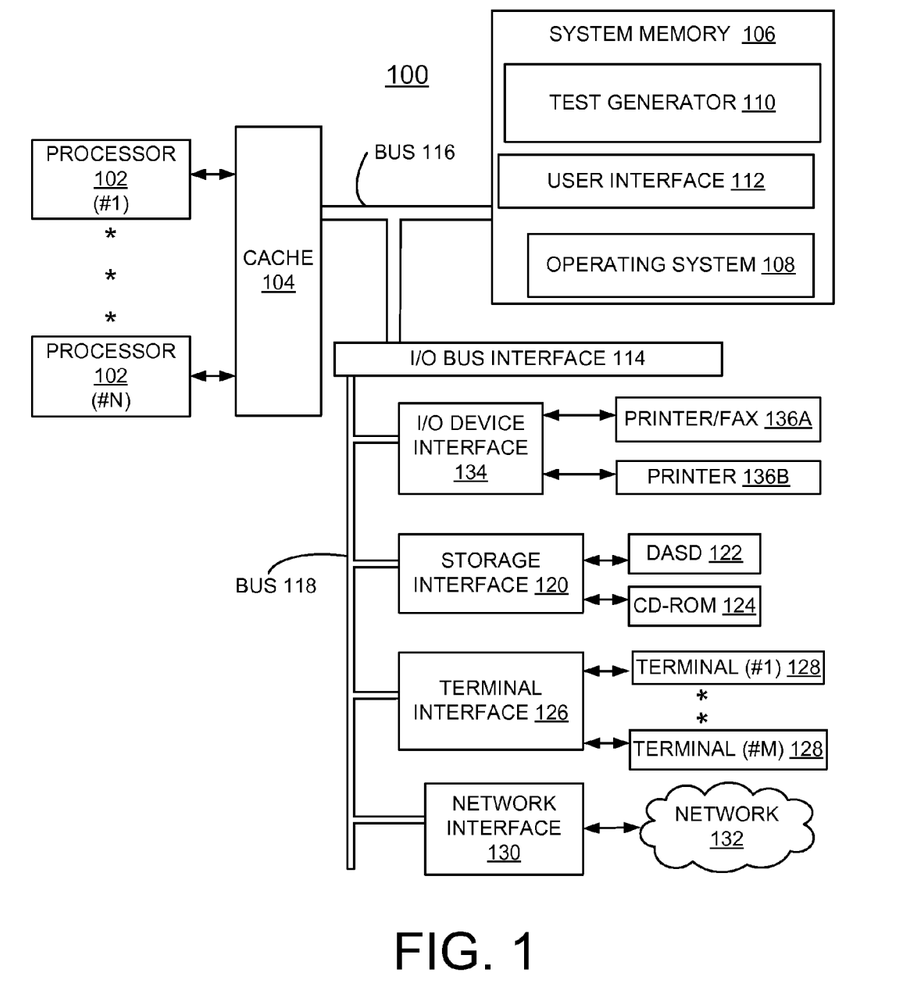
FIG. 1 is a block diagram of an example computer system for implementing functional verification including generating and running constrained random irritator tests for a multiple processor system and for a processor core with multiple threads in accordance with preferred embodiments.

Having reference now to the drawings, in FIG. 1, there is shown an example computer system generally designated by the reference character 100 for implementing functional verification including generating and running constrained random irritator tests for a multiple processor system and for a processor core with multiple threads in accordance with preferred embodiments. Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a system memory 106, an operating system 108, a test generator 110 in accordance with an embodiment of the invention and a user interface 112. System memory 106 is a random-access semiconductor memory for storing data, including programs. System memory 106 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, system memory 106 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, and a I/O device interface 134 coupled to I/O devices, such as a first printer/fax 136A, and a second printer 136B.

I/O bus interface 114 communicates with multiple I/O interface units 120, 126, 130, 134, which are also known as I/O processors (IOPs) or I/O adapters (IOAs), through system I/O bus 116. System I/O bus 116 is, for example, an industry standard PCI bus, or other appropriate bus technology.

Computer system 100 is shown in simplified form sufficient for understanding the present invention. It should be understood that the present invention is not limited to the illustrated arrangement of computer system 100.

Figure 2:
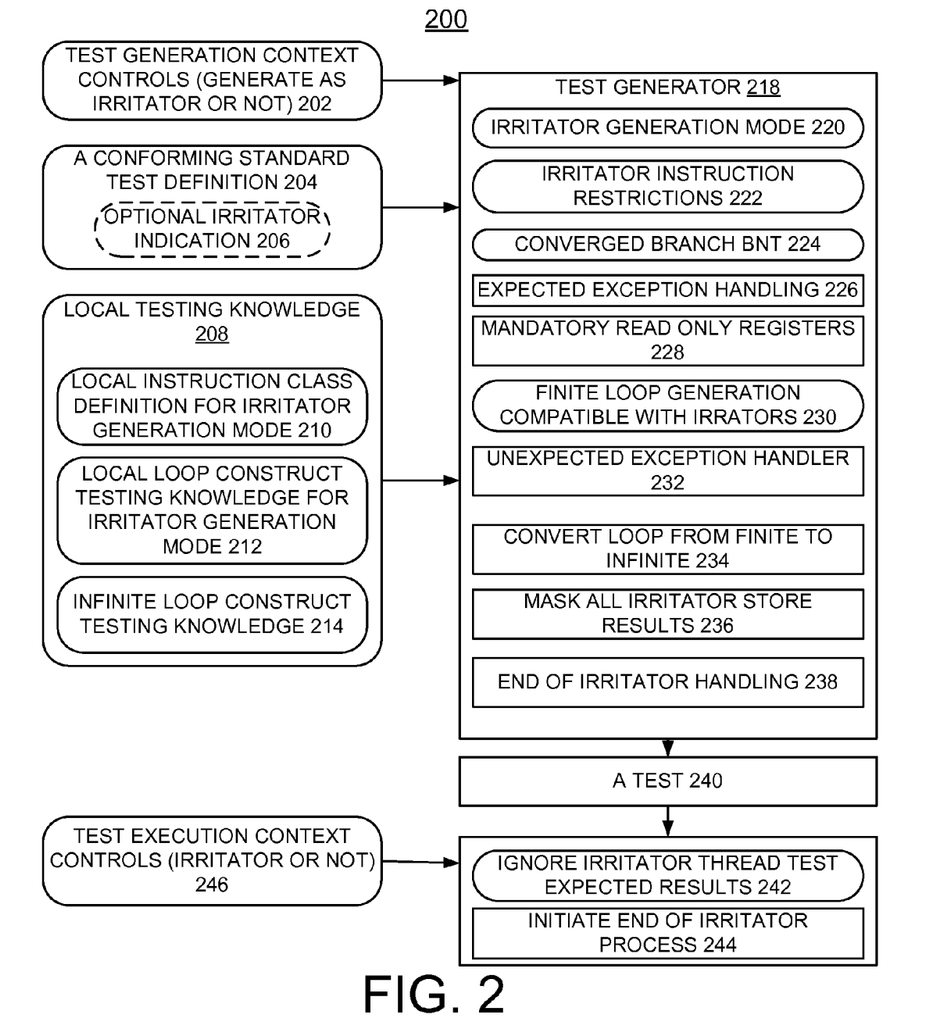
FIG. 2 is a block diagram of a test generator of the system of FIG. 1 for implementing functional verification including generating and running constrained random irritator tests for a multiple processor system and for a processor core with multiple threads in accordance with the preferred embodiment.

Test generation 200 is shown in simplified form as illustrated and described with respect to FIG. 2 and should be understood that the present invention is not limited to the illustrated arrangement of test generation apparatus 200. Example embodiments for implementing test generation 200 in accordance with invention further include the example methods as illustrated and described with respect to FIGS. 4, 5, 6, and 9.

Referring now to FIG. 2 there is shown an example test generator apparatus 200 of the system 100 for implementing functional verification including generating and running constrained random irritator tests for a multiple processor system and for a processor core with multiple threads in accordance with preferred embodiments. Test generator apparatus 200 includes test generation context controls 202 to generate as an irritator or not, and a conforming standard test definition 204 with optional irritator indication 206 in accordance with preferred embodiments. For example, the standard test definition template, such as conforming standard test definition 204 is macro based. Various standard macros, such as, Prolog, Body and Epilog macros are updated to accommodate generating the test as an irritator in test generator apparatus 200.

Test generator apparatus 200 includes local testing knowledge 208 including local instruction class definition for irritator generation mode 210, local loop construct 212 for irritator generation mode, and infinite loop construct testing knowledge 214 in accordance with preferred embodiments.

Test generator apparatus 200 includes a test generator 218 including example enhanced functions of irritator generation mode 220, irritator instruction restrictions 222, converged branch or Branch Not Taken (BNT) 224, expected exception handling 226, mandatory read only registers 228, finite loop generation compatible with irrators 230, unexpected exception handler 232, convert loop from finite to infinite 234, and mask all irritator store results 236 in accordance with preferred embodiments. Test generator apparatus 200 includes a test 240 output of the test generator 218. Test 204 is applied to testing functions ignore irritator thread test expected results 242 and initiate end of irritator process 244 in accordance with preferred embodiments.

Test generator apparatus 200 includes test execution context controls 246 to execute as an irritator or not applied to the testing function ignore irritator thread test expected results 242 and initiate end of irritator process 244.

In accordance with features of the invention, using the disclosed looping method of US 2014/0257739, new alterations are added in accordance with preferred embodiments.

US patent application publication US 2014/0257739 A1 to Dagan et al., published Sep. 11, 2014, entitled "Implementing Random Context of Program Loops in Random Test Generation for Processor Verification" discloses method and apparatus for implementing random content of program loops in random test generation for processor verification.

The subject matter of the above-identified US 2014/0257739 is incorporated herein by reference.

In accordance with features of the invention, more operations (ops) are allowed to be generated randomly and using existing test definitions to generate either a main or irritator test. Branches are handled using the Looping method of US 2014/0257739 that establishes a branch not taken sequence that always ends with an unconditional branch to the original branch target location.

In accordance with features of the invention, storage instructions use Read-Only registers as in the Looping method and the mandatory use of Read-Only registers. However the consequences of inadvertently ignoring or bypassing this requirement for a fully generated loop are that the loop may exit before the intended number of iterations or that a storage operation accesses a new and/or different storage location. As the loop is fully generated, this results in a legal test that poses no adverse consequences in the simulation environment. Such non-conforming behavior in an irritator context results in storage or instruction activity outside of the established storage footprint and results in a failing test in the simulation environment, which is a false fail that uses valuable debug resources. The implementation of Read-Only registers in the irritator context requires updating a few non-conforming behaviors in the test generator to align the generator behavior to the expectations of a truly mandatory Read-Only register use for storage operands. A few complex instructions are dealt with by adding them to a list of instructions that are not allowed to be used in the irritator context. Using this method allows many existing test definition to be generated in the context of an irritator and still generate a legal test and avoid the need to write duplicate test definitions of main or irritator test varieties.

A method exists in a directed test definition of avoiding Read-Only registers for storage operands using specific biasing, and this method is well known to experienced practitioners of the art of constrained random processor verification. As an alternative to using the exact same storage locations each time an irritator loop iterates, storage displacement values, and base, and index registers advantageously are maintained by the test definition to vary slightly, either randomly or periodically and guarantee that no matter how many iterations an irritator loop will make in simulation, the storage footprint will never leave a predefined range. Using this method requires detailed knowledge of the simulation environment and its rules on storage footprint checking. For instance, many processor designs use a cached interface to main storage and apply footprint checking to ensure that all storage operations encountered in the test are within any block of storage bounded by a cache line defined in the test. Or, all footprint checking could be disabled in the simulation environment.

Instructions can trigger program exceptions for a number of reasons. Some reasons are related to storage addressing which is described above in (1b). Data flow operations can also experience exceptions when a register values change with successive iterations of a looping sequence. A simple algebraic equation serves to illustrate the problem: y=Remainder(x/y). If this equation is implemented in an irritator test body, then during test generation, a few answers are predicted and there are no exceptions. While in simulation it could loop an indefinite number of times. For integer calculations, with starting values of x=97 and y=11, successive values of y are: 11, 9, 7, 6, 1, 0, divide-by-zero-exception. If the original test generation was, (as disclosed in U.S. Pat. No. 8,479,173B2 for p/irritators), generated once then no exception is predicted in the test. In simulation the first 5 iterations of the equation in the loop result in normal completion of the instruction while the 6th iteration results in a divide by zero exception and execution is transferred to an architected exception handler location, which is not initialized by the test, resulting in a simulation fail and a waste of valuable debug time.

In accordance with features of the invention, the enhanced test generator apparatus 200 solves the above problem, adding a special exception handler to irritator tests. This unexpected-exception handler is the last thing generated in the test and creates a code sequence to restore the machine state to the original condition which existed at the beginning of the irritator loop, and return the program flow to a location provided by the test definition and which in the demonstrated embodiment is the first instruction location of the irritator loop.

A second case of program exceptions to deal with is generating an instruction for which a program exception is predicted. In this case the generated test contains an instruction that experiences a program exception and the exception handler is present in the test. Test generator apparatus 200 uses features that are present in the Looping method to provide deterministic return from the program interrupt handler and to avoid randomization of the return from program interrupt handler. Both of these are now standard controls as test generator directives. Test generator apparatus 200 takes into account any prior predicted program interrupt handlers when placing the new unexpected program interrupt handler.

In accordance with features of the invention, test generator apparatus 200 includes the ability to use the simulation environment to communicate between the main thread and irritator thread simplifies test generation and allows previously generated single thread main tests to be reused with arbitrarily selected irritator tests. It also allows an irritator to avoid a specific interlock code sequence running in the irritator loop. For cases where the object of an irritator requires co-generation with the main thread test, it simplifies generation. In the demonstrated embodiment, the simulation environment is told which thread in a test is a main thread and which is an irritator thread by means of flags placed in the test by the test generator. A main thread will run from start to finish and is guaranteed (in a good hardware design) to reach the finish point. An irritator thread is an infinite loop that will never reach the designated finish point with out intervention. In known test generator apparatus, the simulation environment monitors the main thread to see when it completes, by executing certain instruction(s) at a designated location flagged as the end-of-test in the test case. When the main thread is observed to complete, the simulation environment intervenes in the execution of the irritator thread. For a simple environment, a direct shutdown of all irritator threads by stopping simulation is possible. To avoid complex situations of dealing with simulation environment checkers, that verify that the hardware has actually completed all of its expected tasks and returned to a natural state, it is better to use a natural means of intervention. In the known simulation environment use an external interrupt to terminate all irritator threads after all main threads have completed execution.

In the embodiment of test generator apparatus 200 global test generation controls are used to initialize the architected external interrupt handler location in storage to contain an end-of-test sequence. In test generator apparatus 200, the hardware simulation running the irritator code, experiences an external interrupt and uses natural hardware sequences to redirect the program execution to the end-of-test location at the external interrupt handler location. At this point, the simulation environment finishes normal end of test checking then terminates the simulation of the test.

Figure 4:
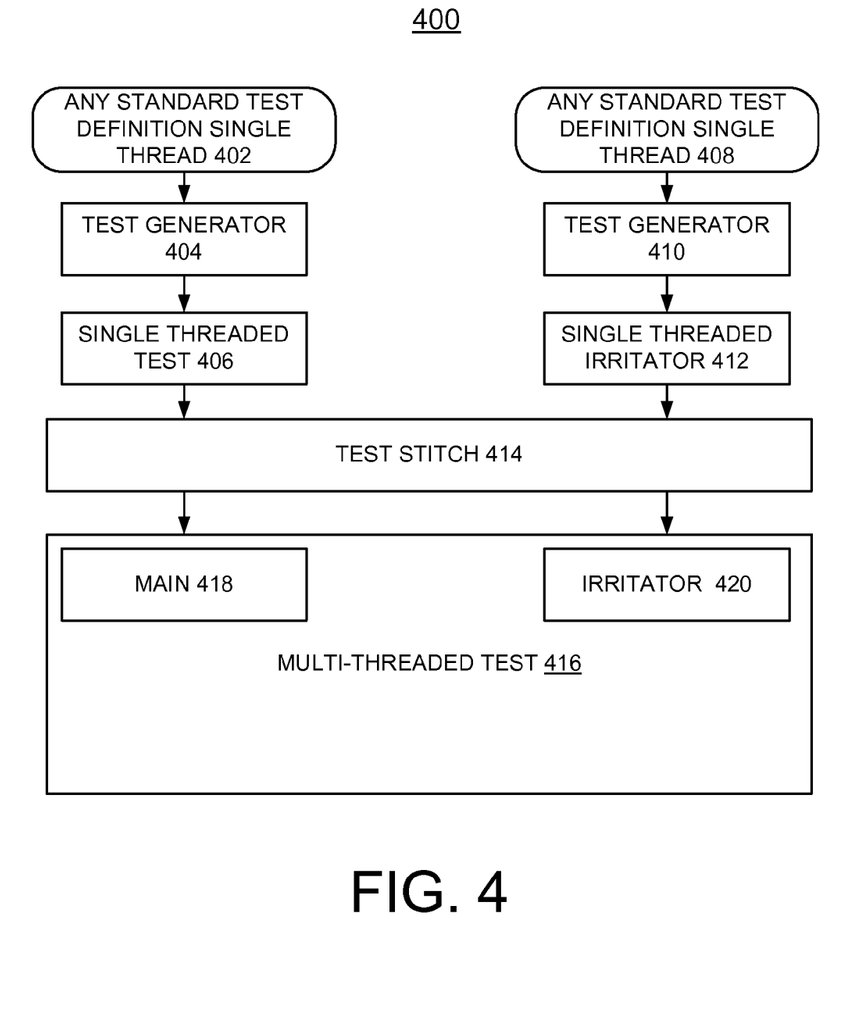
FIG. 4 illustrates an example method for generating and running a single main thread and irritator thread where the main thread and the irritator thread are totally independent and can be randomly mixed in accordance with preferred embodiments.

Referring now to FIG. 4, an example method generally designated by the reference character 400 illustrates generating and running a single main thread and irritator thread where the main thread and the irritator thread are totally independent and can be randomly mixed in accordance with preferred embodiments.

As indicated in a block 402, any standard test definition single thread is applied to a test generator as indicated in a block 404. A single threaded test is provided as indicated in a block 406. In a separate process, any standard test definition single thread as indicated in a block 408 is applied to the test generator as indicated in a block 410. A single threaded irritator is provided as indicated in a block 412. As shown in FIG. 2, enhanced test definition 204 with local testing knowledge 208 allows most standard test definitions to be generated in either a main or irritator context without modification of the test definition. This eliminates the need to write separate test definitions for different contexts. The definitions can be written to provide a single thread as shown at blocks 406 and 412 and allow other processes to manipulate them into multi threaded tests.

A test stitch function is provided as indicated in a block 414. Test definitions can be stitched together before generation (definition stitching), providing a new method used for irritators, but can also be used for general purpose combining of different and unrelated test definitions into new tests that allow the test generator to create shared address interaction between threads that is not possible with simple test stitching. As indicated in a block 416, a multi-threaded test is provided including a main test 418 and an irritator test 402.

Figure 5:
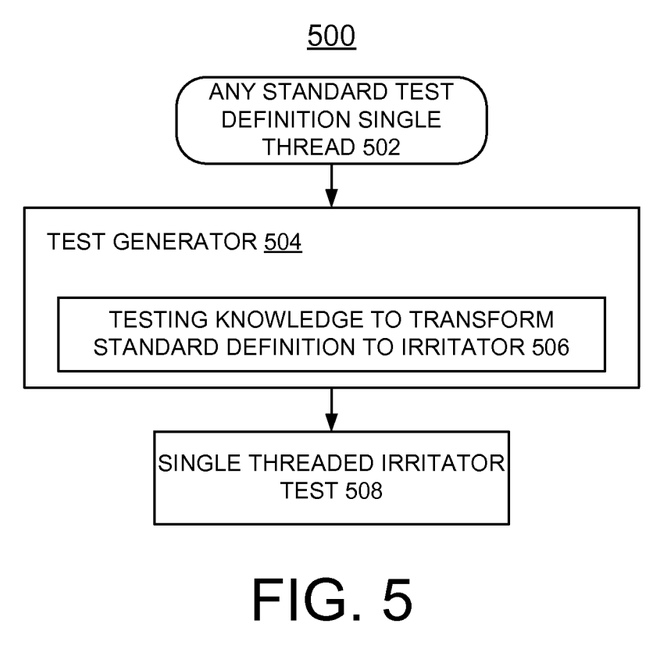
FIG. 5 illustrates an example method for transforming of any standard single threaded test definition into an irritator thread that can be stitched to a random main thread test in accordance with preferred embodiments.

Referring now to FIG. 5, an example method generally designated by the reference character 500 illustrates transforming of any standard single threaded test definition into an irritator thread that can be stitched to a random main thread test in accordance with preferred embodiments. As indicated in a block 502, any standard test definition single thread is applied to a test generator as indicated in a block 504, which includes standard knowledge to transform the standard definition to irritator as indicated in a block 406. A single threaded irritator test is provided as indicated in a block 508.

Figure 6:
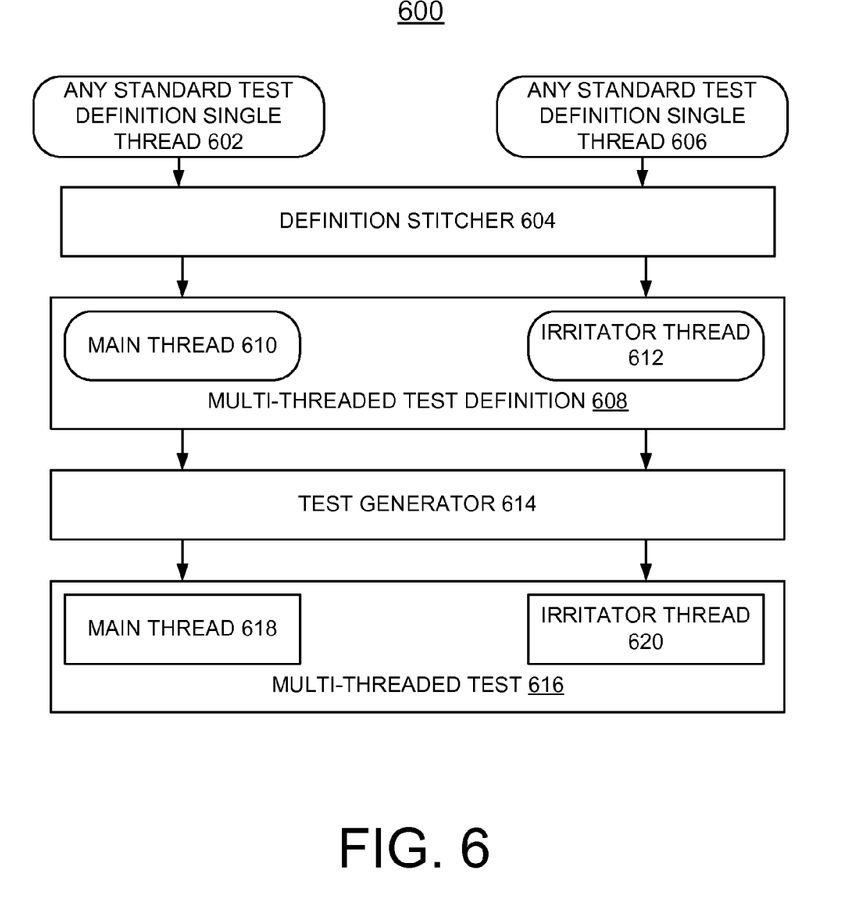
FIG. 6 illustrates an example method for test definition stitching allowing any standard single threaded test definitions to be combined to form a test definition with multiple threads with main and irritator threads in accordance with preferred embodiments.

Referring now to FIG. 6, an example method generally designated by the reference character 600 illustrates test definition stitching allowing any standard single threaded test definitions to be combined to form a test definition with multiple threads with main and irritator threads in accordance with preferred embodiments. As indicated in a block 602, any standard test definition single thread is applied to a test definition stitcher as indicated in a block 604. Any standard test definition single thread as indicated in a block 606 is applied to the test definition sticher at block 604. A multi-threaded test definition as indicated in a block 608 includes a main thread 610 and an irritator thread 612. A test generator 614 receives the multi-threaded test definition 608 including the main thread 610 and irritator thread 612 provides an output applied to a multi-threaded test function as indicated in a block 616, which includes a main thread 618 and irritator thread 620.

Figure 7:
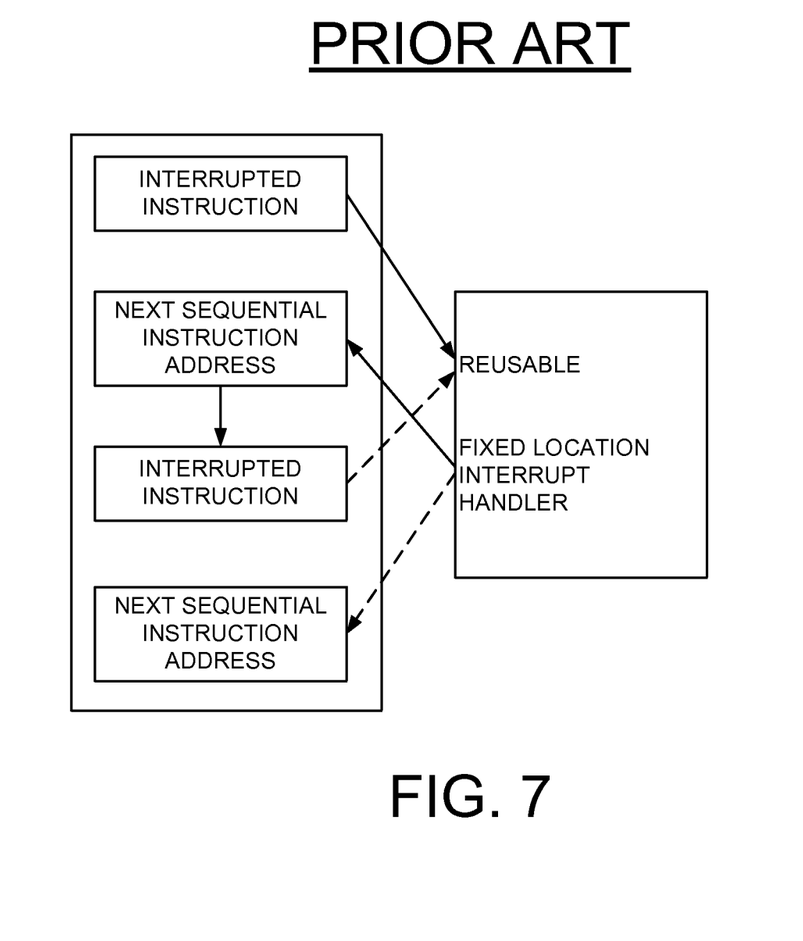
FIGS. 7 and 8 illustrate respective prior art exception handlers.
Figure 8:
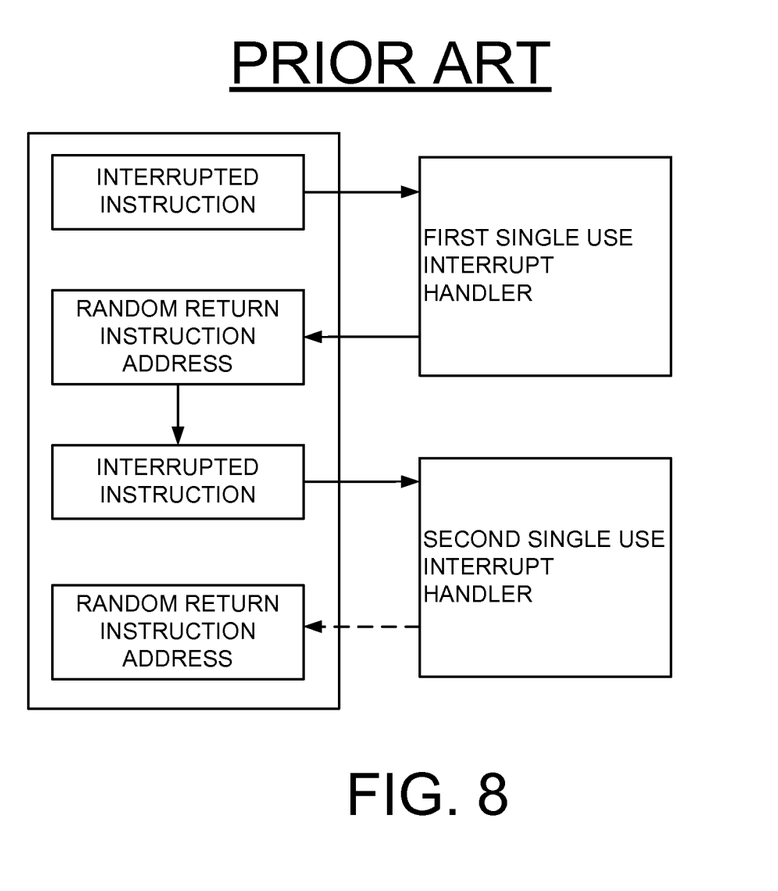
Figure 9:
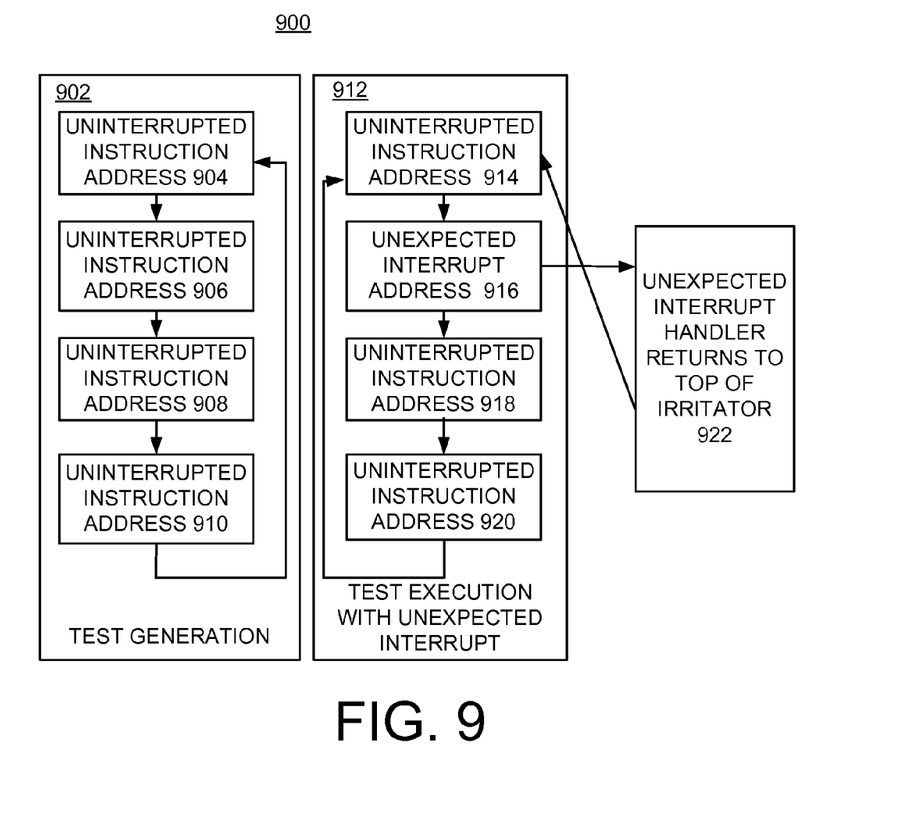
FIG. 9 illustrates an example method for implementing an unexpected exception handler that returns control of the irritator program stream to a known location and a known state, such as to top or bottom of the irritator loop in accordance with preferred embodiments.

Referring now to FIG. 9, an example method generally designated by the reference character 900 illustrates implementing an unexpected exception handler that returns control of the irritator program stream to a known location and a know state, such as to top or bottom of the irritator loop in accordance with preferred embodiments. FIGS. 7 and 8 illustrate respective prior art exception handlers.

In accordance with features of the invention, any instruction that can get an exception due to iterative execution in a loop can be tolerated by addition to the test of an unexpected exception handler that returns control of the irritator program stream to a known location and a know state, such as to top or bottom of the irritator loop.

In FIG. 9, method 900 includes a test generation function 902 including an example loop including uninterrupted instruction addresses 904, 906, 908, 910, returning to uninterrupted instruction address 904 and continuing. Method 900 includes a test execution function 912 including an example loop including uninterrupted instruction addresses 914, 918, 920, returning to uninterrupted instruction address 914 and continuing. An unexpected interrupt address 916 triggers an unexpected interrupt handler 922 that returns control of the irritator program stream to a known location and a known state, such as the top of the irritator loop at uninterrupted instruction address 914, as shown.

Figure 10:
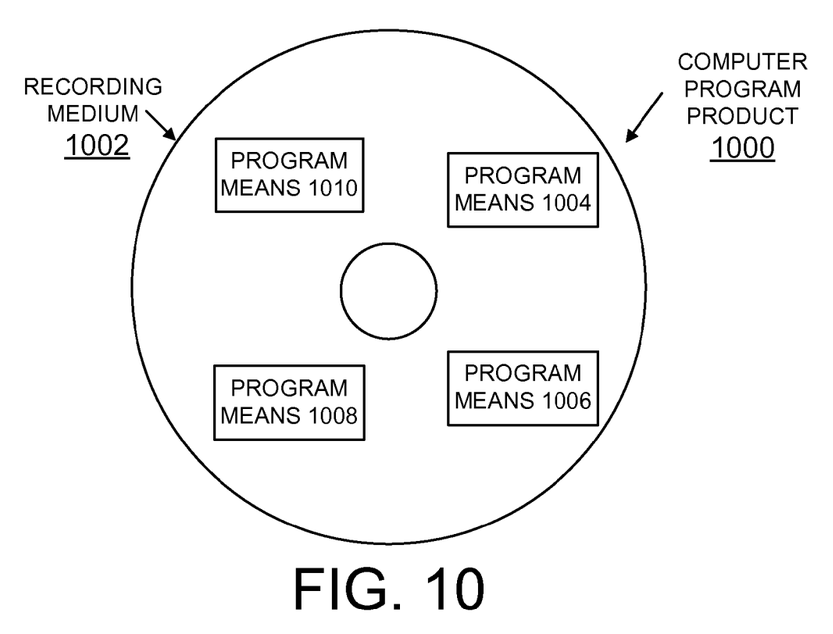
FIG. 10 is a block diagram illustrating a computer program product in accordance with the preferred embodiment.

Referring now to FIG. 10, an article of manufacture or a computer program product 1000 of the invention is illustrated. The computer program product 1000 is tangibly embodied on a non-transitory computer readable storage medium that includes a recording medium 1002, such as, a floppy disk, a high capacity read only memory in the form of an optically read compact disk or CD-ROM, a tape, or another similar computer program product. Recording medium 1002 stores program means 1004, 1006, 1008, and 1010 on the medium 1002 for carrying out the methods for implementing functional verification including generating and running constrained random irritator tests for a multiple processor system and for a processor core with multiple threads in system 100 of FIG. 1.

A sequence of program instructions or a logical assembly of one or more interrelated modules defined by the recorded program means 1004, 1006, 1008, and 1010, direct the computer system 200 for implementing functional verification including generating and running constrained random irritator tests for a multiple processor system and for a processor core with multiple threads While the present invention has been described with reference to the details of the embodiments of the invention shown in the drawing, these details are not intended to limit the scope of the invention as claimed in the appended claims.

What is claimed is:

1. A computer system for implementing functional verification including generating and running constrained random irritator tests for a multiple processor system and for a processor core with multiple threads comprising:

a processor;

a test generator apparatus;

said processor using said test generator including test generation context controls for generating separate tests including a main test, and an irritator test for testing the multiple threads with the generated main test and each generated irritator test being completely independent;

said processor using said test generator for saving the generated main test and each irritator test and randomly mixing the generated main test and each irritator test;

said processor using said test generator for combining the saved generated main test and each irritator test and mixed generated main test and each irritator test, wherein the main test is not forced to be generated with any particular irritator;

said processor using said test generator, implementing an unexpected exception handler for returning control of an irritator program stream to a known location and a known state at an uninterrupted instruction address in the irritator program stream;

said processor using said test generator, running constrained random irritator tests, monitoring the main test and running the main test from start to finish; and said processor using said test generator, responsive to identifying the main test to complete, intervening in execution of each irritator test.

2. The system as recited in claim 1 includes control code stored on a computer readable medium, and wherein said processor uses said control code for generating and running the constrained random irritator tests.

3. The system as recited in claim 1 includes said test generator apparatus receiving a test definition with local testing knowledge, allowing said processor using said test generator for generating standard test definitions in a main context and an irritator context without modification of the test definition.

4. The system as recited in claim 3 includes said test generator apparatus receiving said test generation context controls and wherein said test generator apparatus includes an irritator generation mode.

5. The system as recited in claim 1 wherein said test generator apparatus includes an expected exception handling function.

6. The system as recited in claim 1 wherein said test generator apparatus includes an unexpected exception handler.

7. The system as recited in claim 6 wherein said processor using said test generator and said unexpected exception handler for returning control of an irritator program stream to said known location and said known state responsive to an unexpected exception interrupt.

8. The system as recited in claim 1 includes said test generator apparatus receiving a first test definition single thread and a second test definition single thread, each applied to a definition stitcher for definition stitching and generating multi-threaded test definition.

9. The system as recited in claim 1 includes said test generator apparatus receiving a test definition with local testing knowledge including local instruction class definition for irritator generation mode.

10. The system as recited in claim 9 wherein said local testing knowledge includes local loop construct for irritator generation mode.

11. The system as recited in claim 9 wherein said local testing knowledge includes infinite loop construct testing knowledge.

* * * * *